United States Patent
Vasquez (10) Patent No.: US 7,046,747 B2
(45) Date of Patent: May 16, 2006

(54) VITERBI DECODER AND DECODING METHOD USING RESCALED BRANCH METRICS IN ADD-COMPARE-SELECT OPERATIONS

(75) Inventor: Maximino Vasquez, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 703 days.

(21) Appl. No.: 10/123,764

(22) Filed: Apr. 16, 2002

(65) Prior Publication Data

US 2003/0194026 A1 Oct. 16, 2003

(51) Int. Cl.
*H03D 1/00* (2006.01)
*H03M 13/03* (2006.01)

(52) U.S. Cl. .................. 375/341; 714/795; 714/796

(58) Field of Classification Search ............ 375/316, 375/341, 262, 340, 261, 265, 259; 714/786, 714/792, 794–796
See application file for complete search history.

(56) References Cited

U.S. PATENT DOCUMENTS

| | | | | |
|---|---|---|---|---|
| 5,291,499 A | * | 3/1994 | Behrens et al. | ............ 714/796 |
| 5,349,608 A | * | 9/1994 | Graham et al. | ............ 375/341 |
| 5,412,669 A | * | 5/1995 | Foland, Jr. | .................. 714/796 |
| 5,740,203 A | | 4/1998 | Ramaswamy et al. | ...... 375/341 |
| 5,916,315 A | * | 6/1999 | Ryan | ......................... 714/786 |
| 5,970,104 A | * | 10/1999 | Zhong et al. | ............... 375/341 |
| 6,005,898 A | * | 12/1999 | Kaewell, Jr. | ............... 375/341 |
| 6,081,562 A | | 6/2000 | He et al. | .................... 375/341 |
| 6,094,739 A | * | 7/2000 | Miller et al. | ................ 714/792 |
| 6,301,314 B1 | | 10/2001 | Murayama | .................. 375/341 |
| 6,301,684 B1 | | 10/2001 | Watanabe et al. | ........... 714/796 |
| 6,324,226 B1 | | 11/2001 | Sasagawa | .................... 375/341 |
| 6,883,021 B1 | * | 4/2005 | Ahmed et al. | ............. 709/213 |
| 2001/0004391 A1 | * | 6/2001 | Naitou | ....................... 375/341 |
| 2002/0026619 A1 | * | 2/2002 | Nonin | ........................ 714/799 |
| 2003/0118130 A1 | * | 6/2003 | Greenberg et al. | ......... 375/340 |

* cited by examiner

*Primary Examiner*—Tesfaldet Bocure
*Assistant Examiner*—Vineeta Panwalkar
(74) *Attorney, Agent, or Firm*—Schwegman, Lundberg, Woessner & Kluth, P.A.

(57) ABSTRACT

A Viterbi decoder and method rescale branch metrics by a minimum value of a prior state's path metric. A branch metric unit generates branch metrics from groups of bits of a received bit stream, and an ACS operation unit rescales the branch metrics and performs ACS operations to generate path metrics for the next state of the decoder. The rescaled branch metrics may be stored in branch metric registers of the ACS operation unit for use in a subsequent ACS operation. Rather than rescaling path metrics within individual ACS elements, branch metric rescaling is performed outside the individual ACS elements.

29 Claims, 6 Drawing Sheets

VITERBI DECODER AND DECODING METHOD USING RESCALED BRANCH METRICS IN ADD-COMPARE-SELECT OPERATIONS

FIELD OF THE INVENTION

The present invention pertains to electronic communications, and in particular to decoding convolutionally encoded data.

BACKGROUND OF THE INVENTION

Digital communication systems have many ways of transmitting data through noisy communication channels that help facilitate recovery of the data at the receiver. One conventional method involves convolutionally encoding the data prior to transmission. In such a system, convolutional encoding may be performed after the addition of error correction codes and compression of the data. The convolutional encoding process embeds bits in the data stream resulting in a greater number of bits for transmission, depending on the rate of the coder.

In a digital wireless system, for example, in-phase (I) signals and qudrature-phase (Q) signals may be generated from the convolutionally encoded data and modulated onto a carrier frequency for transmission to a receiver. In this way, a wireless communication device can transmit digital information, including voice and data, over a noisy channel to another wireless communication device via a base station, for example.

When receiving communications, the receiver performs a frequency conversion on the received signals and generates the I and Q signals by quadrature detection. An estimate of the original convolutionally encoded data may be reproduced from the I and Q signals. Convolutional decoding may then be carried out to recover the original data. Convolutional encoding provides for error correcting because only some of the possible sequences are valid outputs from the encoder. These sequences correspond to possible paths through a trellis. In digital communication systems, convolutional encoding is performed to help assure that data can be recovered even when the communication environment becomes poor. For example, wireless communication devices are often used in environments with poor or noisy transmission characteristics, such as in a car where distortion occurs in the received signals. A convolutional decoder is conventionally used to reduce bit error rates and enhance performance.

One common convolutional decoding process is known as Viterbi decoding. Viterbi decoding detects a most likely transition path among multiple symbols by estimating the probabilities of transitions in convolutionally encoded serial input data. Decoding of the input data is based on the detected most likely transition path. Accurate decoding results can be obtained even in the case where a sudden large change in the signal level of input data occurs.

A Viterbi decoder is used for maximum likelihood decoding of convolutional codes. From many known code sequences of possible input code sequences, a code sequence is selected as a maximum likelihood code sequence. The selected code sequence may be generated by a convolutional encoder that generates an output sequence closest in code distance to the received data. The maximum likelihood code sequence is referred to as the maximum likelihood path. The decoded data may be obtained from this path. In a Viterbi decoding process, a combination of maximum likelihood branches out of several respective branches reaching the respective encoder states is selected along with a surviving path. This process continues until a predetermined path length is obtained and then a maximum likelihood surviving path is traced back to decode the input signal.

A Viterbi decoder generally includes a branch metric calculation unit and an add-compare-select (ACS) unit. The branch metric calculation unit calculates branch metrics (i.e., distances between the input code sequences and code sequences predicted in respective branches). The ACS unit calculates accumulated path metrics and selects surviving paths. A path metric transition diagram may be prepared based on a trellis diagram.

A convolutional encoder takes k bits at a time and produces groups of n output bits, where n is greater than k. When k is the input data rate and n is the output data rate, the code is known as a k/n code. For example, an encoder that takes one bit at a time and produces two output bits is called a ½ rate coder, while an encoder that takes two bits at a time and produces three bits is a ⅔ rate coder. Different ACS operations are conventionally required for code rates of a different k. For example, when k is one, two-way ACS operations are generally performed because there are two possible paths to each state. When k is two, four-way ACS operations are generally performed because there are four possible paths to each state. In general, a k/n coder has $2^k$ possible paths into each encoder state and $2^k$ way ACS operations are required in the decoder.

The ACS elements of a conventional decoder add a branch metric value to a previous path metric for two or more different paths, then compare the results and select one of the results as the new path metric. ACS elements may also store the branch decision. Normally, a Viterbi decoder is designed to select the best (e.g., the minimum) value of the ACS operation results. Because the branch metrics are positive values, the path metric will continue to grow unbounded through each iteration through the trellis. If the path metric is implemented with a fixed number of bits, which is generally the case for a realizable design, all the path metric values will eventually overflow. The difference between the maximum path metric value and the minimum path metric value is bounded by the maximum branch metric and the decoding depth. This difference has been used by conventional decoders to avoid the overflow problem.

In some conventional decoders, the minimum value of all the path metrics generated within one trellis iteration of the Viterbi algorithm is subtracted from all path metrics before performing the ACS operations. Because the path metrics are fed back to generate the next set of path metrics, only one register exists in the data path. This allows the ACS elements to perform their operation within one clock-cycle. However, to maintain a one clock-cycle processing time, the rescaling circuit must operate without additional registers. This unfortunately increases the processing delay of the ACS elements and decreases the maximum clock-rate at which the ACS element may operate. The additional adders required in the ACS elements of these conventional decoders also increases the circuit area required by the ACS elements on a semiconductor die.

BRIEF DESCRIPTION OF THE DRAWINGS

The appended claims point out different embodiments of the invention with particularity. However, the detailed description presents a more complete understanding of the present invention when considered in connection with the figures, wherein like reference numbers refer to similar items throughout the figures and:

DETAILED DESCRIPTION

The following description and the drawings illustrate specific embodiments of the invention sufficiently to enable those skilled in the art to practice it. Other embodiments may incorporate structural, logical, electrical, process, and other changes. Examples merely typify possible variations. Individual components and functions are optional unless explicitly required, and the sequence of operations may vary. Portions and features of some embodiments may be included in or substituted for those of others. The scope of the invention encompasses the full ambit of the claims and all available equivalents.

The present invention pertains to electronic communications, and in several of the embodiments, to decoders for decoding convolutionally encoded data. Embodiments of the present invention also apply to Viterbi decoders.

Figure 1:
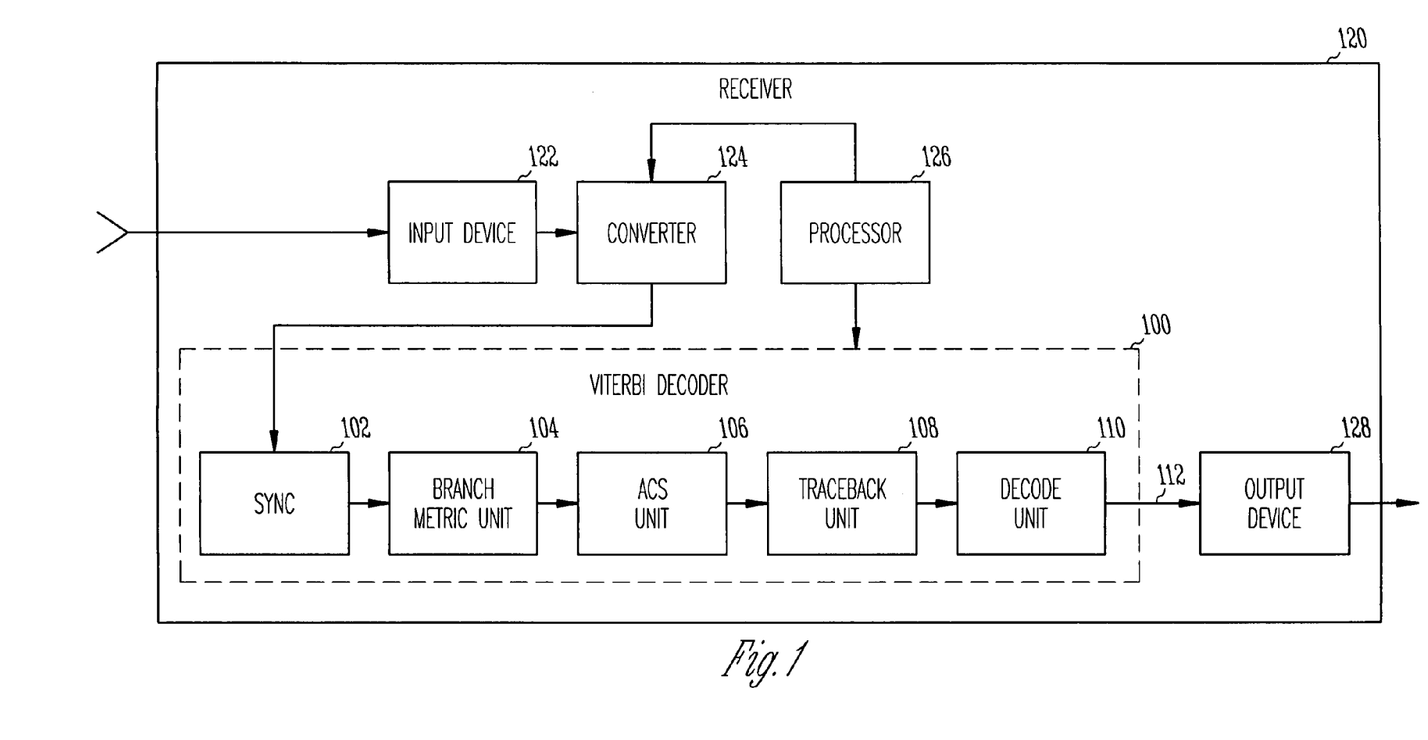
FIG. 1 is a functional block diagram of a receiver in accordance with an embodiment of the present invention.

FIG. 1 is a functional block diagram of a receiver in accordance with an embodiment of the present invention. Receiver 120 is configured to receive convolutionally encoded data which may be decoded by Viterbi decoder 100 and may be especially suitable for receiving data over noisy communication channels. Although the present invention is applicable to almost any communication device, the advantages of the present invention are particularly applicable to wireless, handheld and portable communication devices. By way of example, wireless, handheld and portable communication devices may include wireless and cellular telephones, smart phones, personal digital assistants (PDAs), web-tablets and any device that may provide wireless access to a network such as an intranet or the internet.

An input signal having convolutionally encoded data is received by input device 122 which may, for example, be an antenna, a cable, an optical detector, or the like. Converter 124 may process the received signal to generate in-phase (I) and quadrature-phase (Q) signals which may be down-converted from a modulated carrier frequency to baseband frequency and converted to serial bit streams with an analog to digital converter. The I and Q serial bit streams are provided to Viterbi decoder 100. Using the encoded data streams, decoder 100 calculates branch metrics and path metrics for the data and determines the path of the data that has the greatest likelihood of occurrence. Branch metrics may be based on a code distance between the input bits and transitions to each state of the decoder. The path metrics may be generated by adding a branch metric to a previous path metric for two or more different paths and selecting one of the results as the new path metric. Decoder 100 generates an output decoded data signal indicative of the data that is most likely to have been transmitted, even when the data is received over a very noisy communication channel. Although this embodiment of the present invention is described as using I and Q signal inputs, other embodiments of the present invention are not limited to the use of I and Q modulated signals. For example, the present invention is equally suitable for use with any modulation scheme, and is also suitable for use with baseband signals having no modulation.

In one embodiment, the received bit streams may have been soft decoded where instead of a hard 1 or 0 being used for each bit, multiple bits may be used to indicate a value somewhere between a 1 and a 0. For instance if two bits are used for each value, 00 may mean the received value most closely matches a 0 bit, 01 may mean the received value is about 33% of the way between a 0 bit and a 1 bit, 10 may mean the received value is about 66% of the way between a 0 bit and a 1 bit, and 11 may mean the received value most closely matches a 1 bit.

Decoder 100 includes synchronization unit 102, branch metric unit 104, add-compare-select unit (ACS) 106, trace back unit 108 and decode unit 110. In one embodiment, synchronization unit 102 selects groups of encoded data bits based on feedback signal 112 and provides the selected groups of encoded data bits to branch metric unit 104. The number of bits in a group depends on the rate of the encoder. For example, for a ½ rate encoder, two bits may comprise a group, and for a ⅓ or ⅔ rate encoder, three bits may comprise a group. In general, for a k/n rate decoder, there are n bits per group, and n possible different synchronization points. For a soft decoder, there may be multiple bits per encoded bit, but there are still n synchronization points.

Branch metric unit 104 generates branch metrics for branch transitions between a current state and a possible next state of the encoder. ACS unit 106 adds branch metrics to corresponding prior path metrics to determine a new path metric for each possible state of the encoder and generates a branch decision, which may be stored in a trace-back memory. This process may be repeated for a number of input groups until a decoding length is reached. The decoding length may be five to ten times the constraint length. Trace back unit 108 traces back a surviving path through the trace-back memory based on the branch decisions after this number of transitions through the trellis. Decode unit 110 may then determine a decoded bit sequence based on the surviving path through the trellis.

The Viterbi decoder and decoding method may require less circuit or die area and may be operated at higher clock-cycles than conventional decoders and methods. Furthermore, fewer clock-cycles may be required to perform ACS operations. In one embodiment, a Viterbi decoder and method allow faster ACS performance by rescaling branch metrics by a minimum value of a prior state's path metric. In this embodiment, the Viterbi decoder includes a branch metric unit to generate branch metrics from groups of bits from a received bit stream. The Viterbi decoder also includes an ACS operation unit for rescaling the branch metrics and performing ACS operations to generate path metrics for the next state of the decoder. The rescaled branch metrics may be stored in branch metric registers of the ACS operation unit for subsequent use in an ACS operation. Rather than rescaling path metrics within individual ACS elements, branch metric rescaling can be performed outside the individual ACS elements.

In at least one embodiment, the present invention reduces the amount of logic required for a $2^M$ state Viterbi decoder with a rate of k/n for which M is greater than n. In another embodiment, the present invention allows the use of a higher clock rate in a k/n rate Viterbi decoder reducing the cycle time needed in the ACS unit thereby improving performance.

Figure 2:
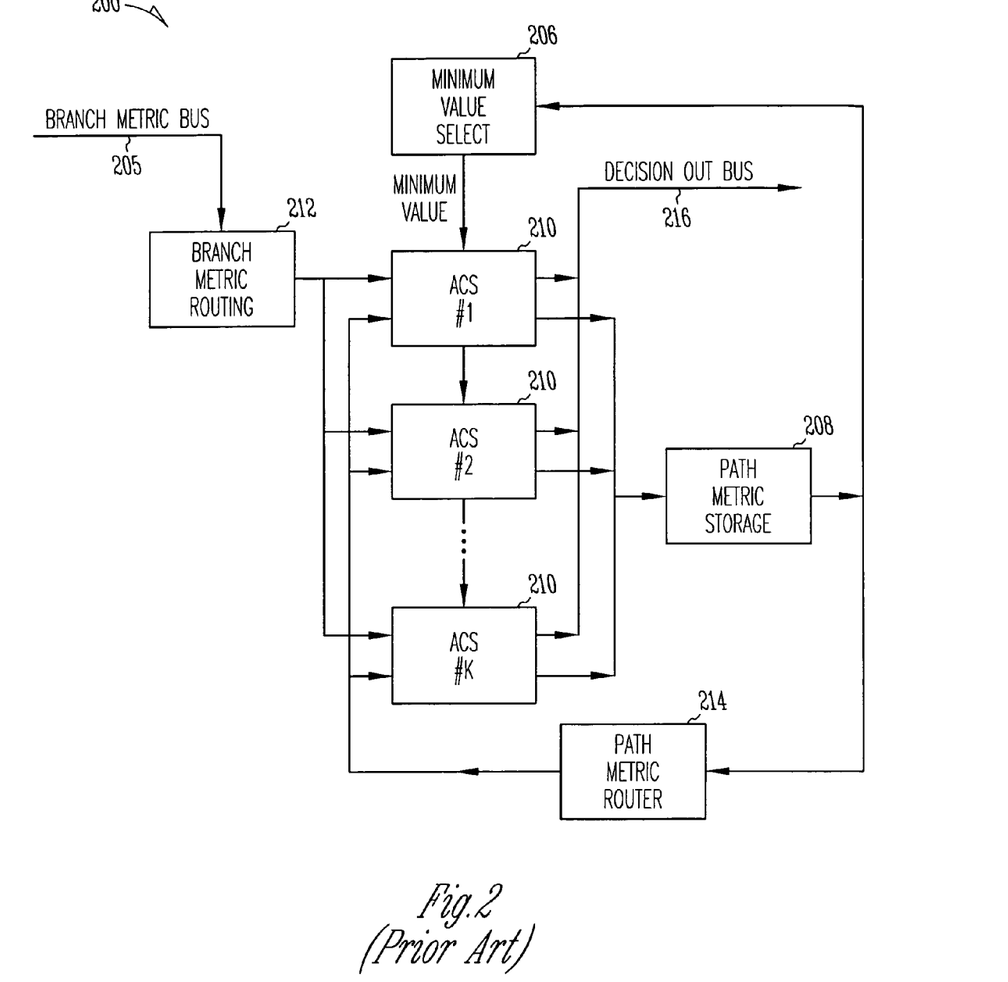
FIG. 2 is a functional block diagram of a conventional add-compare-select operations unit.

FIG. 2 is a functional block diagram of a conventional ACS operations unit. In general, conventional ACS operations unit 200 generates path metrics and branch decisions for each next state of the decoder from branch metrics that are received from a branch metric unit to generate the surviving paths through the trellis. Conventional ACS operations unit 200 receives branch metrics from branch metric bus 205. The branch metrics may be routed by branch metric routing element 212 to an appropriate one of ACS elements 210, where an ACS operation is performed. Each ACS element 210 rescales the path metrics from the prior state of decoder with a minimum value provided by minimum value select logic 206, and performs an ACS operation using the rescaled path metrics and appropriate branch metrics. The ACS operation generates the path metrics and branch decisions for the next states of the decoder, which may be stored in path metric storage element 208. Path metric routing element 214 may route the path metrics to the appropriate one of the ACS elements 210. The branch decisions are provided on branch decision bus 216.

ACS unit 200 rescales the path metrics prior to performing the ACS operations to prevent the path metrics for each next state from growing beyond the number of bits designated for the registers used to store the path metrics. One problem with conventional ACS operations unit 200 is that, because path metric rescaling is performed in each of ACS elements 210, and because there is a feedback path through minimum value select logic 206, additional time within each clock-cycle is required to complete the ACS operation. This limits the maximum clock rate at which ACS unit 200 can operate. Another problem with conventional ACS unit 200 is that it requires a large amount of circuit area because of the number of additional adders required to rescale the path metrics in each of ACS elements 210. For a maximum speed decoder with $2^M$ states, $2^M$ ACS units may be needed, each with additional adders. Furthermore, the added complexity of ACS elements 210 due to the increased adders for rescaling path metrics further limits the maximum clock rate at which ACS unit 200 can operate.

Figure 3:
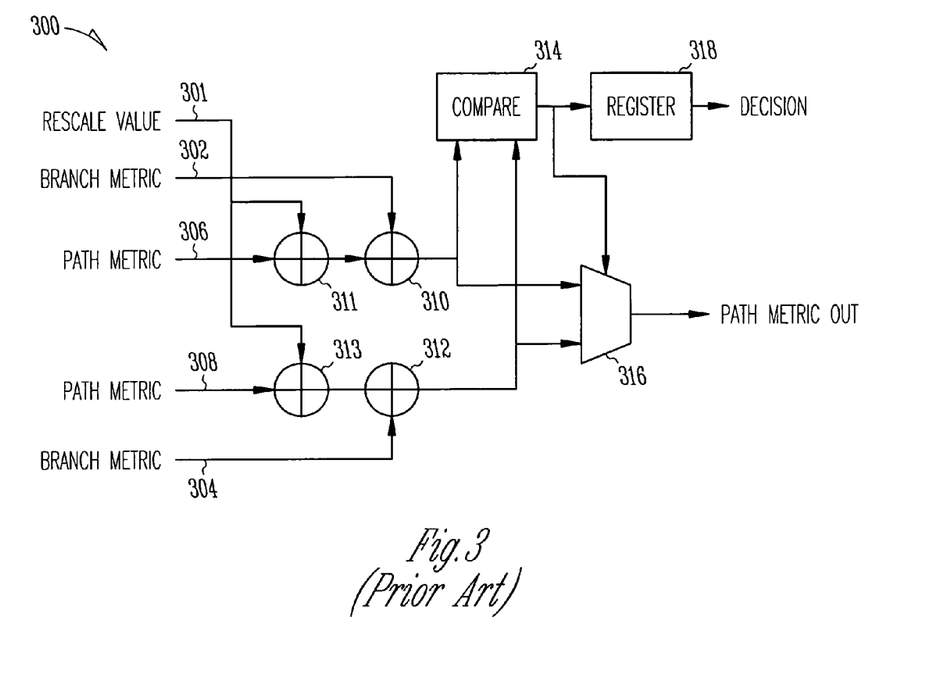
FIG. 3 is a functional block diagram of a conventional two-way add-compare-select element.

FIG. 3 is a functional block diagram of a conventional two-way add-compare-select element. Conventional two-way ACS element 300 is an example of an ACS element which may be used in ACS operations unit 200 (FIG. 2) for one of ACS elements 210. ACS element 300 rescales path metrics by a rescale value prior to performing an ACS operation. Rescale value 301 may be received from minimum value select unit 206 (FIG. 2) and is subtracted from path metrics 306 and 308 in adders 311 and 313 respectively. The rescaled path metrics are added to branch metrics 302 and 304 in adders 310 and 312 respectively to generate the candidate path metrics. The candidate path metrics are compared in compare element 314, and one of the candidate path metrics is selected by select element 316 as the path metric for the current state. The branch decision may be stored in register 318 for subsequent use in tracing back the most likely path and for use in decoding the incoming bit stream. Thus, two sets of adders are required for the performance of each ACS operation. Furthermore, additional adders 311 and 313 increase the cycles required for ACS element 300 to perform an ACS operation.

Figure 4:
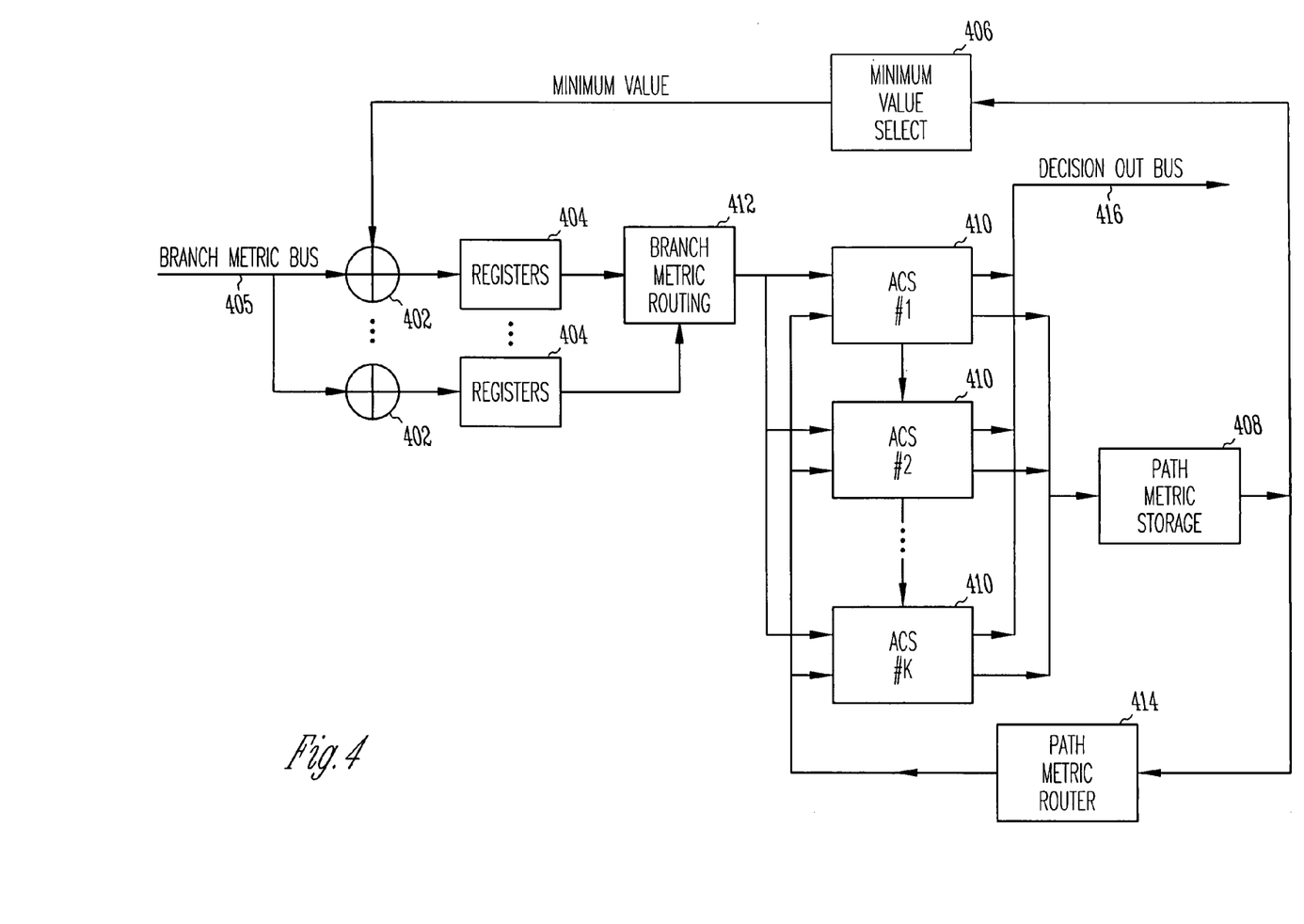
FIG. 4 is a functional block diagram of an add-compare-select operations unit in accordance with an embodiment of the present invention.

FIG. 4 is a functional block diagram of an ACS operations unit in accordance with an embodiment of the present invention. ACS operations unit 400 may reduce the circuit or die area required for a Viterbi decoder. ACS operations unit 400 may also allow a Viterbi decoder to operate at higher clock-cycles than conventional decoders. Furthermore, ACS operations unit 400 may require fewer clock-cycles to perform ACS operations. In one embodiment, ACS performance is achieved by rescaling branch metrics by a minimum value of a prior state's path metric.

ACS operations unit 400 performs ACS operations which may be used for generating path metrics for states of a Viterbi decoder. ACS operations unit 400 is suitable for use as ACS unit 106 (FIG. 1) of decoder 100 (FIG. 1) and is suitable for use in other decoders. ACS operations unit 400, among other things, receives branch metrics and rescales the branch metrics. ACS operations unit 400 also may perform ACS operations using the rescaled branch metrics and path metrics from a prior state of the decoder. ACS operations unit 400 may also generate path metrics for the current state of the decoder. ACS operation unit 400 may also generate branch decisions which may be provided, for example, on branch decision bus 416.

ACS operations unit 400 may include several rescaling adders 402 for rescaling the branch metrics. ACS operations unit 400 may also include several branch metric registers 404 for storing the rescaled branch metrics. The number of rescaling adders 402 and the number of registers 404 may correspond to the number of branch transitions between possible states of the decoder. For example, for a k/n code, the number of rescaling adders 402 may be $2^n$. Rescaling adders 402 may receive branch metrics (which may be unscaled) over branch metric bus 405 from branch metric element 104 (FIG. 1). ACS operations unit 400 also includes minimum value select logic 406, which may select a minimum of the path metric values which may be stored in path metric storage element 408. Path metrics may be stored for each path through the trellis by ACS elements 410, for example. Because the rescaled branch metrics may be negative, branch metric registers 404 may include a sign bit to indicate whether the rescaled branch metric stored therein is positive or negative. For example, when the value subtracted from a branch metric is greater than the branch metric, the rescaled branch metric would be negative.

ACS elements 410 perform an ACS operation to generate the path metrics. In accordance with one embodiment of the present invention, ACS elements 410 add a rescaled branch metric for a branch transition to a path metric for a corresponding path through the trellis. Each of ACS elements 410 may perform this addition for each branch transition to generate candidate path metrics. ACS elements 410 may select the best (e.g., the smallest) of the candidate path metrics as the path metric for that path. The selected path metrics may be stored in path metric storage element 408. ACS unit 400 may also include branch metric routing element 412 which may route the appropriate rescaled branch metric from one of branch metric registers 404 to one of ACS elements 410. ACS unit 400 may also include path metric routing element 414 which may route the appropriate path metrics from path metric storage element 408 to one of ACS elements 410. Routing elements 412 and 414 are optional elements whose function may be provided by elements of a decoder that are external to ACS unit 400. A controller, which may be external to ACS unit 400 may control the operations of routing elements 412 and 414.

ACS elements 410 may be, for example, two-way ACS elements, four-way ACS elements or eight-way ACS elements depending on the number of branch transitions (i.e., possible paths) to each state as well as other requirements of the decoder. For example, when there are two paths to each state, a two-way ACS element may be suitable for ACS element 410. The number of ACS elements 410 included in ACS unit 400 may depend on the number of possible states of the decoder. In the example illustrated in FIG. 4, there are k ACS elements 410 indicating k possible states of the decoder. The number of states may range from two to as many as sixteen or even greater.

Branch metric rescaling adders 402 subtract a value from each of the branch metrics associated with branch transitions between a prior state and a current state of a decoder. Minimum value select logic 406 selects the minimum value of the path metrics for the prior state of the decoder. ACS elements 410 may generate path metrics for the current state of the decoder by adding the rescaled branch metrics to the path metrics for the prior state of the decoder. This process may be repeated for next states of the decoder generating most likely paths through the trellis. During this process, branch decisions may be provided to traceback unit 108 (FIG. 1) on decision-out bus 416.

In one embodiment of the present invention, minimum value select logic 406 selects a rescaling value from each of the branch metrics that may not be the minimum value of the prior states' path metrics. In this embodiment, the rescaling value may be a predetermined value, or a value calculated based on other conditions.

Accordingly, since ACS elements 410 themselves do not need to perform rescaling of path metrics, ACS elements 410 may require fewer adders than conventional ACS elements that rescale path metrics, such as ACS element 300 (FIG. 3). As a result, fewer operations may be performed by the ACS elements and faster clock-rates may be used. Although adders are used to rescale the branch metrics, there may be a lower number of adders in ACS unit 400 because in many implementations there may be fewer branch metrics than path metrics. Branch metric register 404 breaks the feedback path through minimum value select logic 406, effectively removing it from the ACS operation critical path. This reduces the cycle time for the ACS unit, which is usually the critical path in the decoder. This may also allow a faster clock rate to be used. Furthermore, no rescaling of the path metrics is necessary because when the rescaled branch metrics are added to the path metrics in ACS elements 410, the path metrics are already normalized because a value, such as the prior states' minimum value, had been subtracted from each branch metric. Accordingly, the overflow problem of path metric registers may be eliminated.

Figure 5:
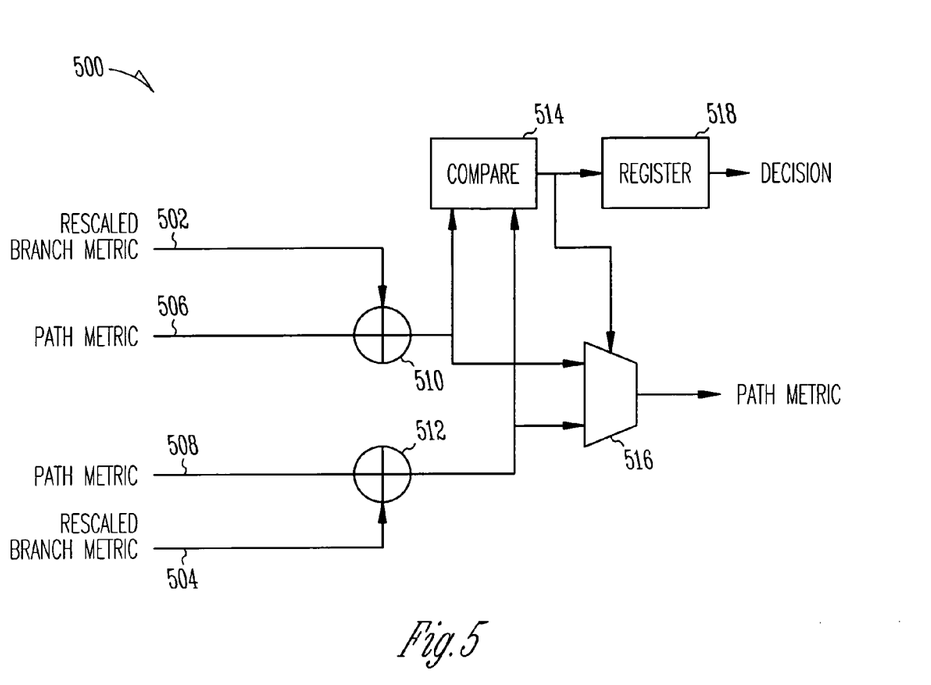
FIG. 5 is a functional block diagram of a two-way add-compare-select element in accordance with an embodiment of the present invention.

FIG. 5 is a functional block diagram of a two-way ACS element in accordance with an embodiment of the present invention. Two-way ACS element 500 is an example of an ACS element that may be suitable for use as one or ACS elements 410 (FIG. 4). Two-way ACS element 500 performs an ACS operation for two possible paths to a state of the decoder. For each of the two paths, rescaled branch metrics 502, 504 are added in adders 510, 512 respectively, to path metrics 506, 508 respectively, to generate two candidate path metrics. The candidate path metrics are compared in compare element 514 and one of the candidate path metrics is selected by select element 516 as the path metric for the current state. A branch decision may be stored in register 518 for subsequent use in tracing back the most likely path and for use in decoding the incoming bit stream. The branch decisions from each of ACS elements 500 may be provided on branch metric decision bus 416 (FIG. 4).

Comparing two-way add-compare-select element 500 with two-way add-compare-select element 300 (FIG. 3) shows that adders 311 and 313 have been eliminated from the ACS operation performed by each of ACS elements 500. This may significantly reduce die area and circuit complexity, especially when many ACS elements 500 are used in a decoder with many possible current states. Additionally, the elimination of the adders may reduce the delay through ACS elements 500, allowing two-way add-compare-select element 500 to operate at a higher clock-rate, further improving the performance of the decoder.

Figure 6:
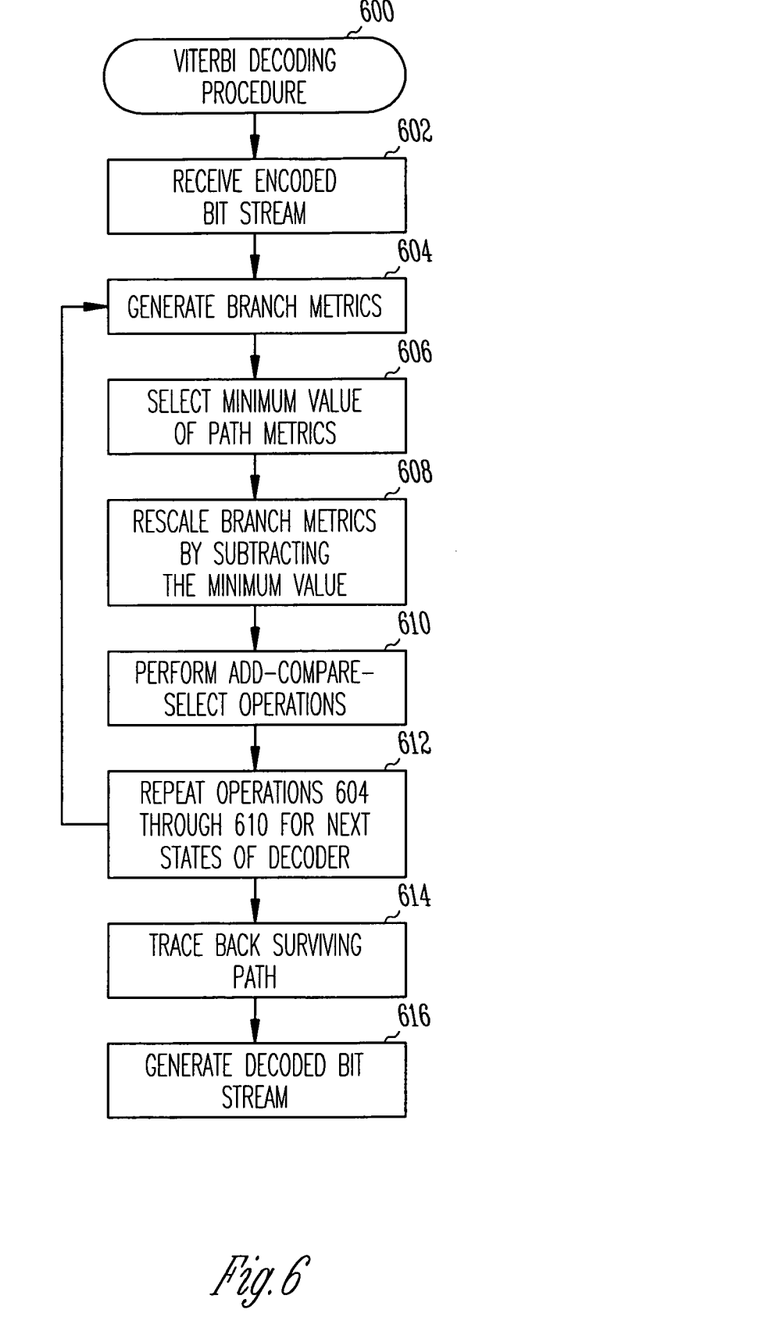
FIG. 6 is a flow chart of a Viterbi decoding procedure in accordance with an embodiment of the present invention.

FIG. 6 is a flow chart of a Viterbi decoding procedure in accordance with an embodiment of the present invention. Although the individual operations of procedure 600 are illustrated and described as separate operations, one or more of them may be performed concurrently or in a different order. Viterbi decoding procedure 600 may be used to decode a convolutionally encoded bit stream in accordance with a Viterbi algorithm. Procedure 600 may be performed by a decoder such as decoder 100 (FIG. 1), although other decoders and devices are also suitable. For example, procedure 600 may be performed by a processor configured with software or a digital signal processor. Furthermore, an embodiment of the present invention includes a computer readable medium which may have program instructions stored thereon for configuring a computer to perform at least portions of procedure 600.

Operation 602 receives an encoded bit stream. The bit stream may be convolutionally encoded data and may be received by a receiver or decoder, which may be part of a wireless communication device. The encoded bit stream may have been encoded with a k/n rate coder where k is the number of input bits and n is the number of output bits and is greater than k. The value of k, for example, may range from one to four or greater, and the value of n, for example, may range from two to five or greater. Operation 602 may include other operations performed by a receiver including generating the in-phase and quadrature phase bit streams from a received signal. Operation 602 provides groups of convolutionally encoded bits based on the code rate. The proper group of bits, may be determined, for example, by a synchronization unit such as synchronization unit 102 of decoder 100 (FIG. 1).

Operation 604 generates branch metrics for branch transitions between the prior state and the current state of the decoder based on the group of bits from operation 602. Branch metrics may be based on a code distance between the code bits and transitions to each state of the decoder. Operation 604 may be performed by branch metric unit 104 of decoder 100 (FIG. 1). The number of branch metrics generated in operation 604 depends on the number of branch transitions between each possible state which may depend on the code rate, and is a maximum of $2^n$.

Operation 606 selects a minimum value of the prior states' path metrics and operation 608 subtracts the selected minimum value from each of the branch metrics generated in operation 604. Minimum select logic 406 (FIG. 4) may perform operation 606 and rescaling adders 402 may perform operation 608. Operation 608 generates rescaled branch metrics, which may be stored in a storage location, such as branch metric registers 404 (FIG. 4).

Operation 610 performs ACS operations using the rescaled branch metrics and the corresponding path metrics from the prior states of the decoder. Operation 610 generates the path metrics and branch decisions for the next state of the decoder, which becomes the current state. Operation 610, for example, may be performed by ACS units 410 (FIG. 4).

Operation 612 repeats operations 604 through 610 for subsequent groups of bits of the received bit stream generating path metrics for subsequent states of the decoder. This process is repeated for a number of times which may equal a decoding length generating surviving paths through the trellis.

Operation 614 traces back a most likely one of the surviving paths through the trellis using the stored branch decisions. Operation 616 generates a decoded bit stream from the most likely surviving path. Operations 614 and 616 may be performed, for example, by trace back unit 108 (FIG. 1) and decode unit 110 (FIG. 1) of decoder 100 (FIG. 1). The decoded bit stream may be used, for example, by a receiver of a wireless communication device, and in the case of voice, may be converter back to audio.

The foregoing description of specific embodiments reveals the general nature of the invention sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Accordingly, the invention embraces all such alternatives, modifications, equivalents and variations as fall within the spirit and broad scope of the appended claims.

What is claimed is:

1. A decoding method comprising:
    subtracting a minimum value of a plurality of path metrics for a prior state of a decoder from each of a plurality of initial branch metrics to generate rescaled branch metrics; and
    performing add-compare-select (ACS) operations using the rescaled branch metrics to generate path metrics for a current state of the decoder.

2. The method of claim 1 further comprising:
    generating the initial branch metrics for branch transitions between the prior state of the decoder and the current state of the decoder; and
    selecting, prior to subtracting, the minimum value of the plurality of path metrics for the prior state of the decoder to subtract from each of the initial branch metrics.

3. The method of claim 2 further comprising generating path metrics for a next state of the decoder by:
    selecting a next minimum value from the path metrics for the current state of the decoder;
    subtracting the next minimum value from each of the initial branch metrics for branch transitions between the current and next state of the decoder to generate rescaled branch metrics for branch transitions between the current state and the next state; and
    performing ACS operations using the rescaled branch metrics between the current and next state to generate the path metrics for the next state of the decoder.

4. The method of claim 2 further comprising storing the rescaled branch metrics in branch metric registers prior to performing the ACS operations.

5. The method of claim 4 wherein the branch metric registers include a sign bit to indicate whether the rescaled branch metric stored therein is positive or negative.

6. The method of claim 1 wherein the branch metrics are calculated for branch transitions between the prior state of the decoder and the current state of the decoder from an input bit stream.

7. The method of claim 1 further comprising:
    routing the rescaled branch metrics from branch metric registers to ACS elements for performing the ACS operations;
    storing the path metrics for the current state of the decoder in a path metric storage element; and
    routing the path metrics from the path metric storage element to the ACS elements for performing the ACS operations.

8. The method of claim 1 wherein the ACS operations are performed within approximately one clock-cycle.

9. An add-compare-select (ACS) unit comprising:
    one or more branch metric rescaling adders to subtract a minimum value from initial branch metrics to generate rescaled branch metrics;
    one or more branch metric registers to store the rescaled branch metrics;
    minimum value select logic to select the minimum value of a plurality of path metrics; and
    ACS elements to perform ACS operations with the rescaled branch metrics and the plurality of path metrics.

10. The ACS unit of claim 9 wherein:
    the one or more branch metric rescaling adders subtract the minimum value from each of the branch metrics associated with branch transitions between a prior state and a current state of a decoder,
    the minimum value select logic selects the minimum value of a plurality of path metrics for the prior state of the decoder, and
    the ACS elements generate path metrics for the current state of the decoder by adding the rescaled branch metrics to the path metrics for the prior state of the decoder.

11. The ACS unit of claim 9 wherein the one or more branch metric registers include a sign bit to indicate whether one of the rescaled branch metrics stored therein is positive or negative.

12. The ACS unit of claim 9 wherein a number of the branch metric rescaling adders correspond to a number of branch transitions between possible states of a decoder, and wherein a number of the branch metric registers correspond to a number of branch transitions between the possible states of the decoder.

13. The ACS unit of claim 9 further comprising a branch metric routing element to route the rescaled branch metrics from the one or more branch metric registers to the ACS elements.

14. The ACS unit of claim 9 further comprising:
    a path metric storage element to store the path metrics for a current state of a decoder; and
    a path metric routing element to route the path metrics from the path metric storage element to the ACS elements.

15. The ACS unit of claim 9 wherein each ACS element performs an ACS operation within approximately one clock-cycle.

16. A Viterbi decoder comprising:
    a branch metric unit to calculate branch metrics from an input data stream;
    an add-compare-select (ACS) unit to generate path metrics; and
    a trace back unit to select a surviving path for use in decoding the input data stream,
    wherein the ACS unit includes branch metric rescaling adders to subtract a minimum value of the path metrics for a prior state of the decoder from each of the branch metrics to generate rescaled branch metrics, and ACS elements to perform ACS operations with the rescaled branch metrics and the path metrics.

17. The decoder of claim 16 wherein the ACS unit further comprises:

branch metric registers to store the rescaled branch metrics; and minimum value select logic to select the minimum value from the path metrics, wherein the branch metric rescaling adders subtract the minimum value from each of the branch metrics to generate the rescaled branch metrics.

18. The decoder of claim 17 wherein:

the branch metric rescaling adders subtract the minimum value from each of a plurality of branch metrics associated with branch transitions between the prior state and a current state of the decoder, the minimum value select logic selects the minimum value of a plurality of path metrics for the prior state of the decoder, and the ACS elements generate path metrics for the current state of the decoder by adding the rescaled branch metrics to the path metrics for the prior state of the decoder.

19. The decoder of claim 17 wherein the branch metric registers include a sign bit to indicate whether one of the rescaled branch metrics stored therein is positive or negative.

20. The decoder of claim 17 wherein a number of the branch metric rescaling adders corresponds with a number of branch transitions between possible states of the decoder, and wherein a number of the branch metric registers corresponds with the number of branch transitions between states of the decoder.

21. The decoder of claim 17 wherein the ACS unit further comprises;

a branch metric routing element to route the rescaled branch metrics from the branch metric registers to the ACS elements;

a path metric storage element to store the path metrics for a current state of the decoder; and a path metric routing element to route the path metrics from the path metric storage element to the ACS elements.

22. A method of decoding an input data stream comprising:

calculating branch metrics from an input data stream;

subtracting a minimum value of a plurality of path metrics for a prior state of a decoder from each of the branch metrics to generate rescaled branch metrics;

performing add-compare-select (ACS) operations using the rescaled branch metrics to generate path metrics for a current state of the decoder; and select a surviving path based on the path metrics for use in decoding the input data stream.

23. The method of claim 22 wherein the branch metrics are generated for branch transitions between the prior state of the decoder and the current state of the decoder, and wherein the method further comprises, prior to subtracting, selecting the minimum value of the plurality of path metrics for the prior state of the decoder to subtract from each of the branch metrics.

24. The method of claim 23 further comprising generating path metrics for a next state of the decoder by:

selecting a next minimum value from the path metrics for the current state of the decoder;

subtracting the next minimum value from each of the branch metrics for branch transitions between the current and next state of the decoder to generate rescaled branch metrics between the current and next state; and performing ACS operations using the rescaled branch metrics between the current and next state to generate the path metrics for the next state of the decoder.

25. The method of claim 23 further comprising storing the rescaled branch metrics in branch metric registers prior to performing the ACS operations, the branch metric registers including a sign bit to indicate whether the rescaled branch metric stored therein is positive or negative.

26. The method of claim 23 wherein each ACS operation is performed within approximately one clock-cycle.

27. A receiver to receive wireless communications comprising:

an input device to receive convolutionally encoded data over a wireless communication channel;

a converter to convert the convolutionally encoded data to a sequence of bits;

a Viterbi decoder to decode the sequence of bits; and an output device to convert the decoded sequence of bits to an output, wherein the Viterbi decoder includes an add-compare-select (ACS) unit comprising:

branch metric rescaling adders to subtract a minimum value from initial branch metrics to generate rescaled branch metrics;

branch metric registers to store the rescaled branch metrics;

minimum value select logic to select the minimum value of a plurality of path metrics for a prior state of the decoder; and ACS elements to perform ACS operations with the rescaled branch metrics and the plurality of path metrics.

28. The receiver of claim 27 wherein:

the branch metric rescaling adders subtract the minimum value from each of the initial branch metrics associated with branch transitions between the prior state and a current state of the decoder.

29. The receive of claim 28 wherein:

the ACS elements generate path metrics for the current state of the decoder by adding the rescaled branch metrics to the path metrics for the prior state of the decoder.

* * * * *

UNITED STATES PATENT AND TRADEMARK OFFICE
CERTIFICATE OF CORRECTION

PATENT NO. : 7,046,747 B1 Page 1 of 1
APPLICATION NO. : 10/123764
DATED : May 16, 2006
INVENTOR(S) : Vasquez

It is certified that error appears in the above-identified patent and that said Letters Patent is hereby corrected as shown below:

On the face page, in field (56), under "U.S. Patent Documents", in column 2, line 11, delete "B1" and insert - - B2 - -, therefor.

In column 12, line 50, in Claim 29, delete "receive" and insert - - receiver - -, therefor.

Signed and Sealed this

Fifteenth Day of August, 2006

JON W. DUDAS
*Director of the United States Patent and Trademark Office*